United States Patent
Osato

(10) Patent No.: US 7,819,672 B2
(45) Date of Patent: Oct. 26, 2010

(54) ELECTRICAL CONNECTING APPARATUS WITH INCLINED PROBE RECESS SURFACES

(75) Inventor: Eichi Osato, Fuchu (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 33 days.

(21) Appl. No.: 12/440,190

(22) PCT Filed: Sep. 21, 2007

(86) PCT No.: PCT/JP2007/069122

§ 371 (c)(1),
(2), (4) Date: Mar. 5, 2009

(87) PCT Pub. No.: WO2008/044509

PCT Pub. Date: Apr. 17, 2008

(65) Prior Publication Data

US 2010/0190361 A1   Jul. 29, 2010

(30) Foreign Application Priority Data

Oct. 12, 2006  (JP) .............................. 2006-278218

(51) Int. Cl.
*H01R 12/00*  (2006.01)
(52) U.S. Cl. .......................................... 439/66; 439/72
(58) Field of Classification Search ................... 439/66, 439/68, 71, 72
See application file for complete search history.

(56) References Cited

U.S. PATENT DOCUMENTS 7,338,293 B2 *  3/2008  Gilk .............................. 439/66
7,445,465 B2 * 11/2008  Lopez et al. ................... 439/72

FOREIGN PATENT DOCUMENTS

| JP | 2003123874 | 4/2003 |
|----|------------|--------|
| JP | 2004325451 | 11/2004 |
| JP | 2005326307 | 11/2005 |
| JP | 2006216399 | 8/2006 |

* cited by examiner

*Primary Examiner*—Tho D Ta
(74) *Attorney, Agent, or Firm*—Ingrassia Fisher & Lorenz, P.C.

(57) ABSTRACT

An electrical connecting apparatus comprises a housing having a first recess extending in a first direction in a horizontal plane, opened downward, and having at least a backside inward surface and a plurality of slits spaced in the first direction and extending in a second direction intersecting the first direction in the horizontal plane, a plurality of contacts each arranged in the housing in a state of extending inside the slit from within the first recess and electrically connecting a conductive portion provided on a board to an electrode of a device under test, and a probe holder arranged in the first recess. The backside inward surface of the first recess includes an inclined portion inclined to both the horizontal plane and a vertical plane vertical to it in a state of being further to the front side towards the upper side, and each contact abuts on the inclined portion at least at part of the back end. Thus, slip of the contact against the conductive portion is reduced.

7 Claims, 7 Drawing Sheets

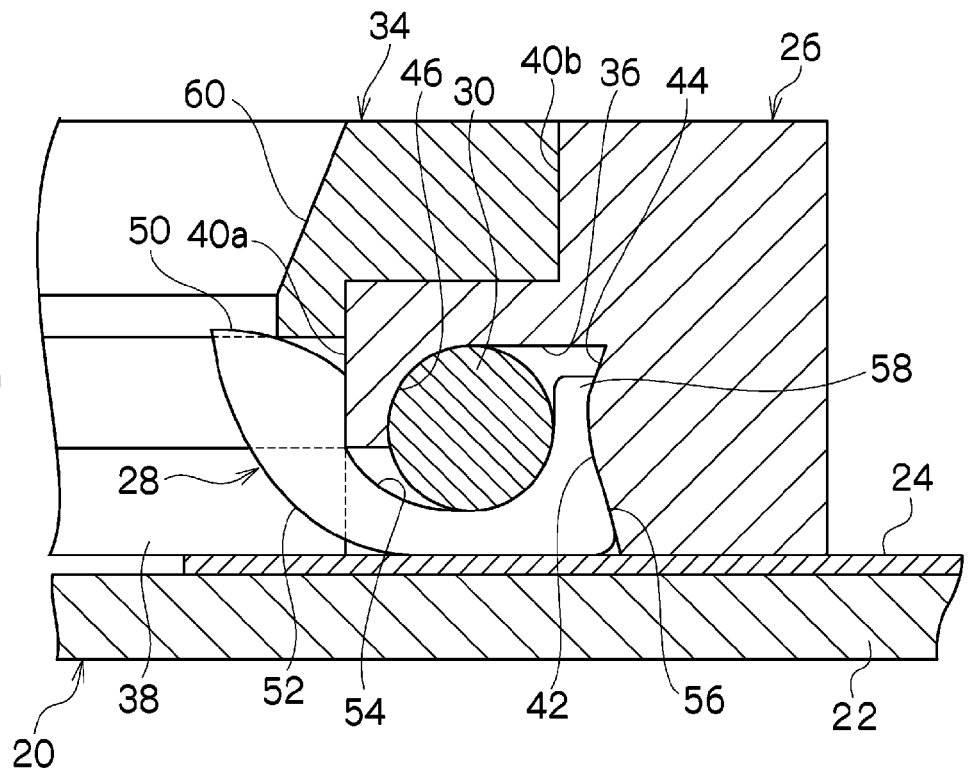
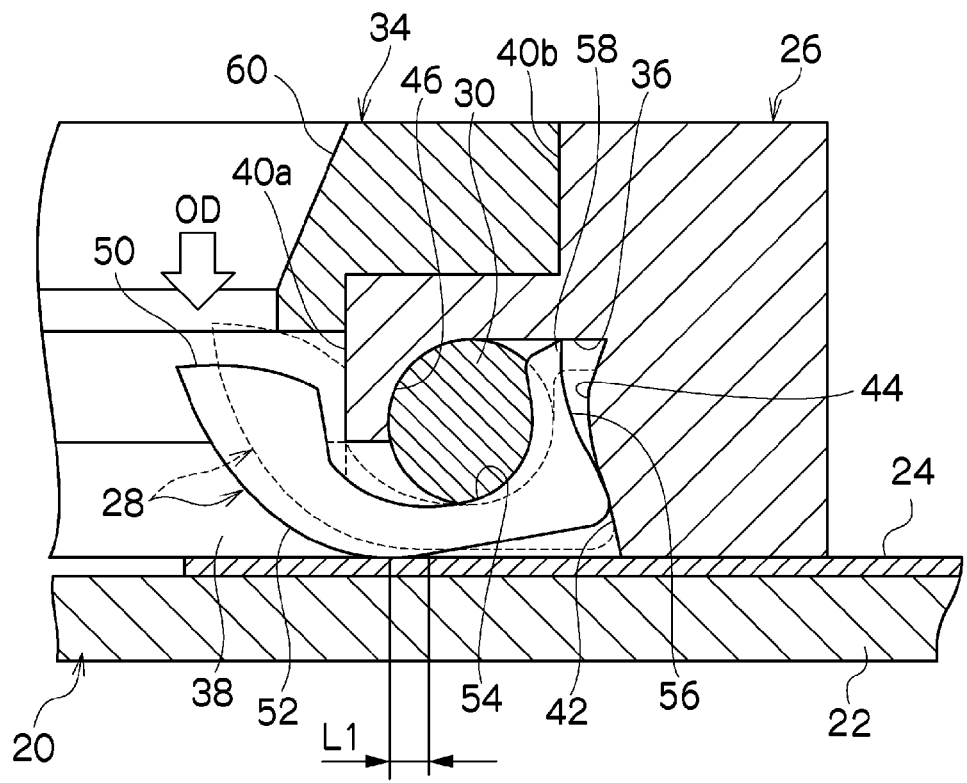

ELECTRICAL CONNECTING APPARATUS WITH INCLINED PROBE RECESS SURFACES

TECHNICAL FIELD

The present invention relates to an electrical connecting apparatus for use in an electrical test of a flat-plate-shaped device under test such as an integrated circuit and, more specifically, relates to an apparatus electrically connecting a conductive portion formed on a board to an electrode of the device under test.

BACKGROUND ART

A semiconductor device such as an integrated circuit has a plurality of electrodes projecting from a device main body. The semiconductor device of this kind undergoes an electrical test (inspection) with use of an electrical connecting apparatus referred to as a socket. As one of the electrical connecting apparatuses of this kind, there is one described in Patent Literature 1, for example.

Patent Literature 1: Japanese Patent Appln. Public Disclosure No. 2003-123874

An electrical connecting apparatus described in Patent Literature 1 includes a plate-shaped housing 100, a plurality of plate-shaped contacts 102 arranged in parallel in the housing 100, and a bar-like probe holder 104 arranged in the housing 100 so as to extend in the arrangement direction of the contacts 102, as shown in FIGS. 7(A), (B), and (C).

Such a connecting apparatus is attached to a board 106 such as a wiring board by a plurality of screw members penetrating the housing 100 in its thickness direction and screwed in the board 106. The board 106 has a plurality of strip-shaped conductive portions 108 as part of wires of a wiring pattern on the upper surface of an electrical insulating plate member 110.

The housing 100 has a recess 112 extending in a first direction in the horizontal plane and opened downward, a plurality of slits 114 spaced from one another in the first direction and extending in a second direction perpendicular to the first direction in the horizontal plane, and an opening 116 opened upward and downward and communicating at its lower end portion with the upper portions of the slits 114.

Each slit 114 communicates at its one end portion and its other end portion in the longitudinal direction with the recess 112 and the opening 116, respectively, and is opened at least downward.

Each contact 102 extends in an arc inside the slit 114 from within the recess 112, projects at a tip end (that is, a probe tip) 118 into the opening 116, and directs a curved external surface 120 toward the conductive portion 108.

The probe holder 104 is made of a rubber material such as silicon rubber in a columnar shape and is arranged in the recess 112 in a state of abutting on the contacts 102.

The contact 102 abuts at part of the arc-like external surface 120 on the upper surface of the conductive portion 108 and abuts at its back end surface 122 on a backside inward surface 124 of the recess 112 in a state where the connecting apparatus is attached to the board 106.

When the tip end 118 of each contact 102 and an electrode of a device under test are thrust relatively, an overdrive force OD acts on the contact 102. Accordingly, each contact 102 compresses and elastically deforms the probe holder 104 and angularly rolls on the upper surface of the conductive portion 108 in a state of abutting the curved external surface 120 on the conductive portion 108.

As a result of the above, each contact 102 scrapes away part of the electrode of the device under test and electrically connects the electrode of the device under test to the conductive portion 108. Under this state, an electrical test of the device under test is performed.

However, in the above electrical connecting apparatus, the relative thrust between the tip end 118 of the contact 102 and the electrode of the device under test causes slip between the tip end 118 and the conductive portion 108, as a result of which the conductive portion 108 is damaged through repeated use.

The above phenomenon is explained in further details as follows.

FIG. 7(A) shows a state where the tip end 118 of the contact 102 and the electrode of the device under test are not thrust relatively. In this state, the back end surface 122 of the contact 102 abuts on the backside inward surface 124 of the recess 112.

When the tip end 118 of the contact 102 and the electrode of the device under test are thrust relatively, the contact 102 angularly rolls over the conductive portion 108 in a state where its back end is upward, as shown in FIG. 7(B). At this time, since the contact 102 presses the probe holder 104 to the tip end side and compressively deforms the probe holder 104 so as to press against the probe holder 104 from the backside to the front side, the back end surface 122 of the contact 102 is distanced by a distance L2 from the backside inward surface 124 of the recess 112.

However, since the probe holder 104 is compressively deformed, the contact 102 moves backward by the distance L2 due to a reactive force along with the compression of the probe holder 104 under a state where the back end surface 122 contacts the backside inward surface 124, as shown in FIG. 7(C).

At the time of the above backward movement, the contact 102 is displaced relative to the conductive portion 108 under a state where the curved external surface 120 contacts the conductive portion 108. Consequently, slip occurs between the curved external surface 120 and the conductive portion 108.

The above slip between the two sides occurs every time the overdrive force OD acts on the contact 102. Thus, through repeated electrical tests, the conductive portion 108 abrades away, and electrical connection between the conductive portion 108 and the contact 102 becomes unstable.

SUMMARY OF INVENTION

Technical Problem

It is an object of the present invention to reduce slip of a contact against a conductive portion.

Solution to Problem

An electrical connecting apparatus according to the present invention comprises a housing having a first recess extending in a first direction in a horizontal plane, opened downward, and having at least a backside inward surface and a plurality of slits spaced from one another in the first direction and extending in a second direction intersecting the first direction in the horizontal plane, a plurality of contacts each arranged in the housing in a state of extending inside the slit from within the first recess and electrically connecting a conductive portion provided on a board to an electrode of a device under test, and a probe holder arranged in the first recess.

The first recess has at least the backside inward surface. Each slit is spaced in the first direction, extends in the second direction intersecting the first direction in the horizontal plane, communicates at one end portion in the longitudinal direction of the slit with the first recess, and is opened at least upward and downward.

Each contact has a tip end projecting upward from the slit so as to be thrust to the electrode relatively, a back end directing to the backside inward surface, and an external surface curved and directing to the conductive portion. The probe holder abuts on a part opposite the external surface of the contact so as to bring the external surface of the contact into contact with the conductive portion.

The backside inward surface of the first recess includes an inclined portion inclined to both the horizontal plane and a vertical plane vertical thereto such that the front side becomes higher, and each contact abuts on the inclined portion at least at part of the back end.

A corner portion on the lower side of the back end of each contact may be curved in an arc.

The back end of each contact may include an inclined portion that is an inclined surface opposed to the inclined portion of the backside inward surface and that is inclined to both the horizontal plane and the vertical plane vertical thereto such that the front side becomes higher The inclined portion of the backside inward surface and the inclined portion of each contact may abut on each other under a state where the tip end and the electrode are not thrust to each other.

The housing may further have a second recess opened upward and communicating at its lower end portion with the upper portion of the slit, and each contact may let the tip end project toward the second recess.

The electrical connecting apparatus may further comprise a guide plate arranged in the second recess and having an opening that guides the device under test so that the electrodes of the device under test abut on the tip ends of the contacts.

Each contact may extend in an arc inside the slit from within the first recess.

The first recess may have on the upper side of the inclined portion a drop preventing portion preventing the contacts from dropping from the first recess in cooperation with the back ends of the contacts.

The drop preventing portion may include an engaging surface set back from the upper end of the inclined portion of the drop preventing portion such that the backside becomes higher, and each contact may have at the upper portion of the inclined portion of the contact a projection projecting backward so as to be able to engage with the engaging surface.

Advantageous Effects of Invention

When an overdrive force acts on the contact, the contact angularly rolls around the probe holder relative to the conductive portion in a direction in which the back end rises under a state where it elastically deforms the probe holder and lets part of its back end, especially the lower corner portion, contact the inclined portion of the backward inward surface.

In the present invention, since the inclined portion of the backside inward surface is inclined to both the horizontal plane and the vertical plane vertical thereto such that the front side becomes higher and contacts at least part of the back end of the contact, the contact is displaced to bring a state where the back end is higher and is prevented from moving backward at the time of the above rolling.

Thus, with the present invention, slip of the contact relative to the conductive portion is reduced, and abrasion of the conductive portion and the contact is drastically reduced.

When the overdrive force acts, the contact is displaced as a result of the slip of the contact part of the contact relative to the inclined portion of the backside inward surface, but if the lower corner portion at the back end of each contact is curved in an arc, the contact part of the contact slips smoothly relative to the inclined portion on the backside inward surface.

BRIEF DESCRIPTION OF THE DRAWINGS

FIG. 5 shows enlarged cross-sectional views of the vicinity of the contact of the electrical connecting apparatus shown in FIG. 1, wherein (A) shows a state where an overdrive force does not act on the contact, and (B) shows a state where the overdrive force acts on the contact.

DESCRIPTION OF THE REFERENCE SIGNS

Figure 1:
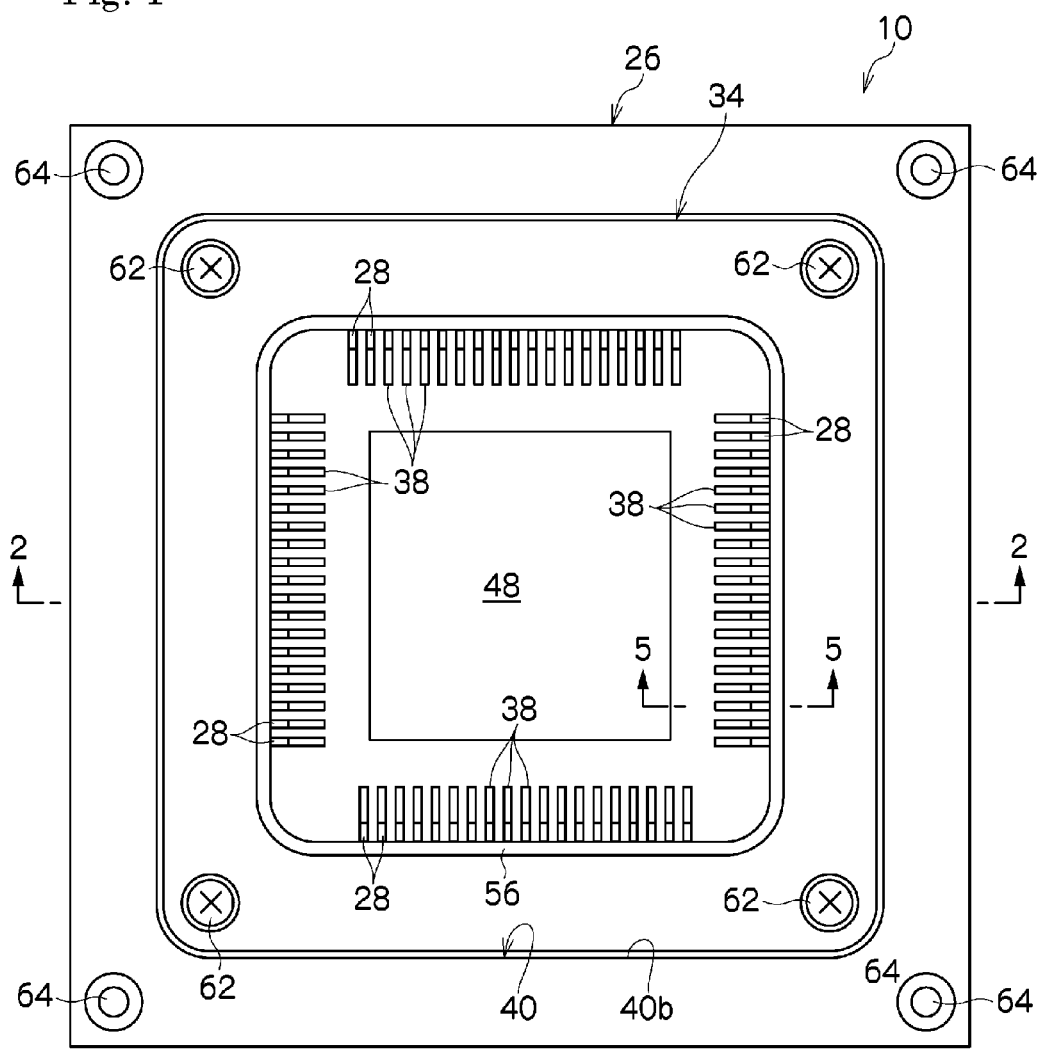
FIG. 1 is a plan view showing one embodiment of an electrical connecting apparatus according to the present invention.

10 electrical connecting apparatus
12 device under test
14 main body
16 electrode
20 board
22 plate member
24 conductive portion
26 housing
28 contact
30 probe holder
34 guide plate
36 first recess
38 slit
40 second recess
44 drop preventing portion
46 arc surface of the first recess
48 plate-shaped portion of the housing
50 tip end of the contact
52 external surface of the contact
54 recess of the contact
56 inclined portion at the back end of the contact
58 projection at the back end of the contact
60 recess of the guide plate

DESCRIPTION OF INVENTION

About Terms

Figure 2:
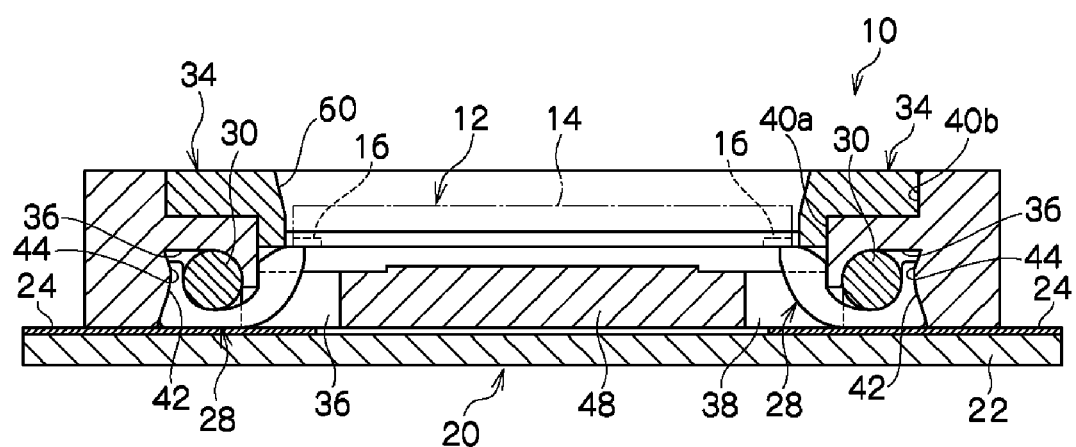
FIG. 2 is a cross-sectional view obtained along the line 2-2 in FIG. 1.
Figure 3:
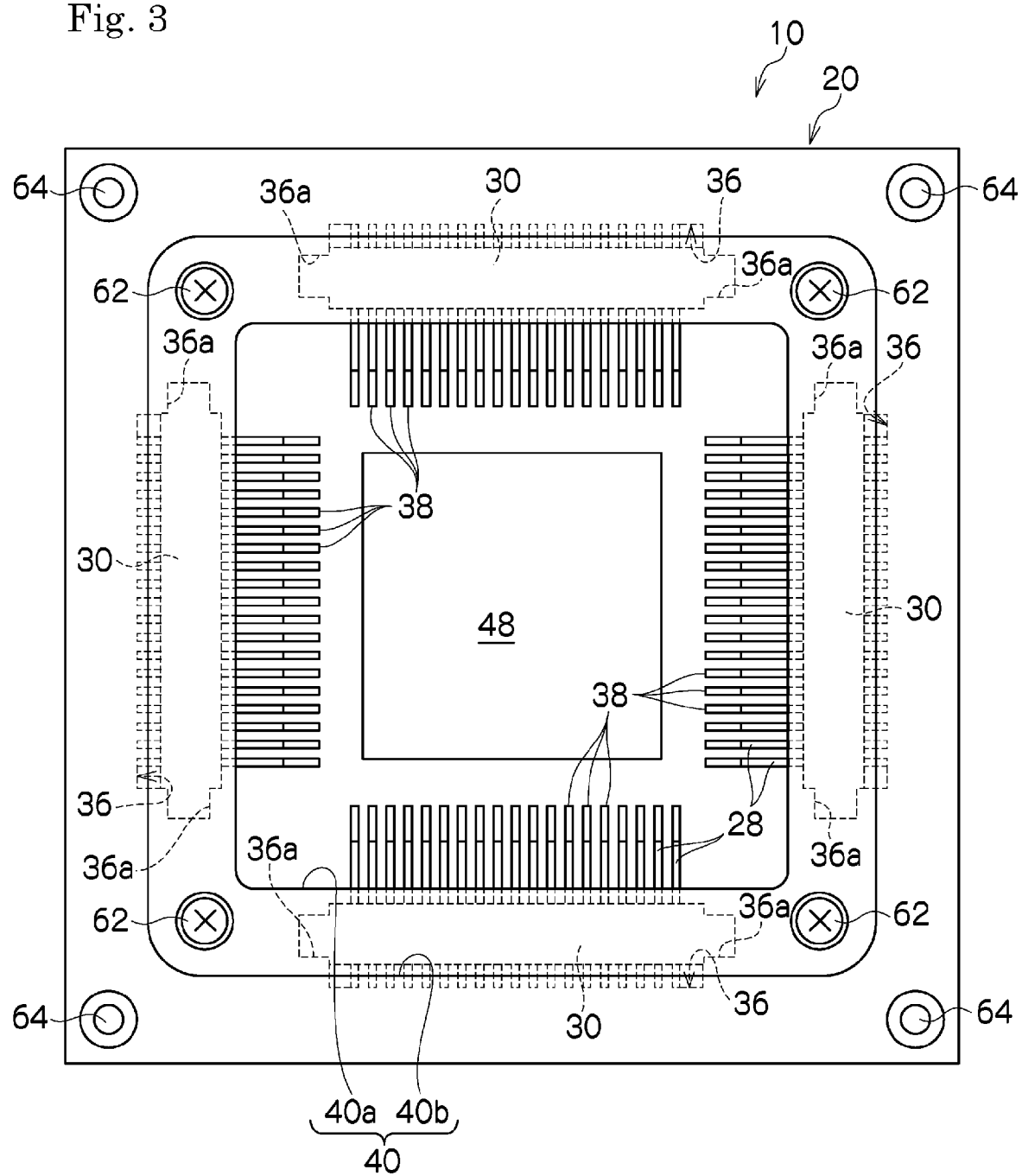
FIG. 3 is a plan view of the electrical connecting apparatus shown in FIG. 1 in a state where a guide plate has been removed.

In the present invention, in FIG. 2, the right-left direction is referred to as an X direction, the direction in the backside of the drawing sheet direction is referred to as a Y direction, and the up-down direction is referred to as an up-down direction or a Z direction. However, these directions differ depending on the posture in which a device under test is arranged in a testing apparatus.

Accordingly, as for the above directions, the X direction and the Y direction may be determined to be within any one plane of a horizontal plane, an inclined surface inclined to the horizontal plane, and a vertical plane vertical to the horizontal plane or may be determined to be a combination of these planes in accordance with an actual testing apparatus.

Also, in the present invention, the tip end (probe tip) side of a contact is referred to as a front side, and the side opposite to it is referred to as a backside.

DESCRIPTION OF EMBODIMENTS

Referring to FIGS. 1 to 6, an electrical connecting apparatus 10 is used as an auxiliary apparatus in an electrical test (that is, an inspection) of a flat-plate-shaped device under test 12. The device under test 12 is a semiconductor device such as a packaged or molded integrated circuit, a not-yet-packaged or not-yet-molded integrated circuit, etc. in the example shown in the figures.

The device under test 12 has a main body 14 formed in a rectangular plate-like shape and a plurality of electrodes 16 provided at each side of the rectangle on one surface of the main body 14 as shown in FIG. 2. The electrodes 16 are formed in short strip shapes, are divided into four electrode groups each corresponding to each side of the rectangle of the main body 14, and are arranged in parallel per electrode group.

A board 20 such as a wiring board to attach the electrical connecting apparatus 10 thereto is a wiring board in which a conductive wiring pattern is formed by a printed wiring technique on one surface of a plate member 22 made of an electrical insulating material such as glass-containing epoxy resin and has on one surface of the plate member 22 a plurality of strip-shaped wiring portions or conductive portions 24 each corresponding to each electrode 16 of the device under test 12, as shown in FIGS. 2 to 5.

Each conductive portion 24 is part of the wiring pattern. The conductive portions 24 are divided into four conductive portion groups each corresponding to each side of the rectangle of the main body 14 of the device under test 12 and are formed in parallel per conductive portion group in a state of extending in a direction intersecting the corresponding side and being distanced in the longitudinal direction of the side in the vicinity of the corresponding side.

The board 20 is generally manufactured by a user performing an electrical test of the device under test 12 in accordance with a type of the device under test 12. However, the board 20 may be manufactured on the part of a manufacturer of the connecting apparatus 10.

As shown in FIGS. 1 to 6, the electrical connecting apparatus 10 includes a rectangular plate-shaped housing 26 attached to the board 20, a plurality of plate-shaped contacts 28 arranged in parallel in the housing 26 and each corresponding to each pair consisting of the electrode 16 and the conductive portion 24, a plurality of long probe holders 30 arranged in the housing 26 so as to contact the contacts 28, and a guide plate 34 arranged in the housing 26.

The housing 26 has four first recesses 36 intersecting one another, extending in a first or second direction (X direction or Y direction) in the horizontal plane parallel to the board 20, and opened downward, a plurality of slits 38 spaced in the first or second direction and extending in the second or first direction (Y direction or X direction) in the horizontal plane, and a second recess 40 provided at the center area of the housing 26 and opened upward.

Each first recess 36 corresponds to each side of the rectangle of the main body 14 of the device under test 12 and extends in the longitudinal direction of the corresponding side (first or second direction). The backside inward surface forming each first recess 36 has at the lower portion an inclined portion 42 inclined to both the horizontal plane and the vertical plane vertical to it and at the upper portion a drop preventing portion 44 preventing the contacts 28 from dropping from the housing 26.

The inclined portion 42 is adapted to be an inclined surface inclined to the board 20 such that the upper side is the front side. The drop preventing portion 44 is adapted to be an inclined surface inclined such that the upper side is the backside and is set back from the upper end of the inclined surface 42 so as to prevent the contacts 28 from dropping from the first recess 36 in cooperation with the back end portions of the contacts 28. Thus, the backside inward surface of the first recess 36 projects forward.

Figure 4:
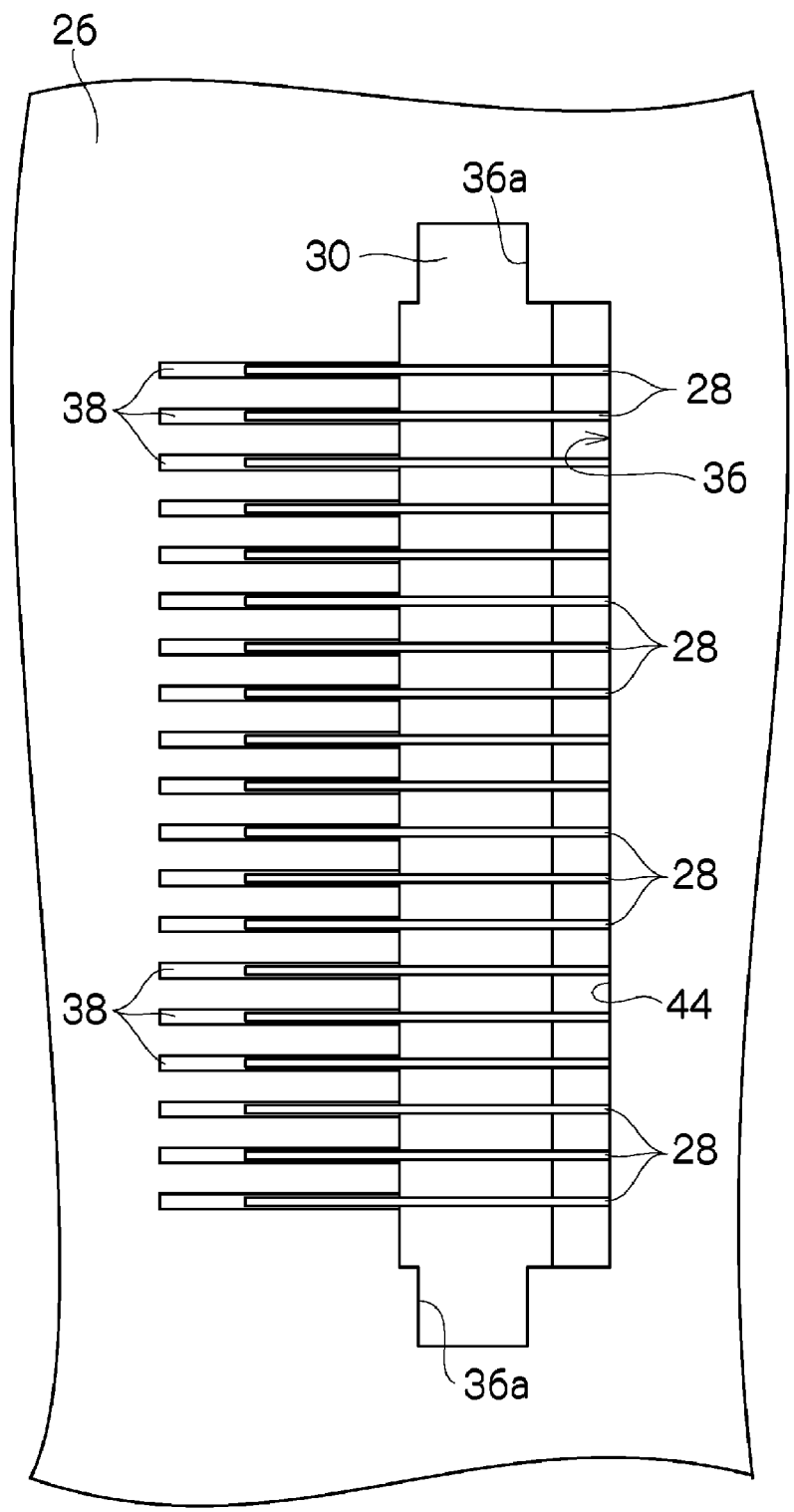
FIG. 4 is an enlarged bottom view of the vicinity of contacts of the electrical connecting apparatus shown in FIG. 1.

The upper corner portion on the tip end side of each first recess 36 is adapted to be an arc surface 46. Both end portions 36a of each first recess 36 are adapted to be U-shaped grooves as shown in FIG. 4. The intermediate area of each first recess 36 is adapted to be an area longer than the length of the arrangement area of the slits 38 of the corresponding slit group.

Each end portion 36a (that is, the U-shaped groove) of the first recess 36 has a smaller curvature radius than a half of the width dimension of the intermediate area of the first recess 36 and a curvature center corresponding to the curvature center of the arc surface 46 so that the end portion of the probe holder 30 is fit in it in a state of interference fit.

The center area of the housing 26 is adapted to be a plate-shaped portion 48 formed in a rectangular shape as seen in a planar state.

The slits 38 are divided into four slit groups each corresponding to each pair consisting of a side of the rectangle of the main body 14 of the device under test 12 and the first recess 36 and are spaced in the longitudinal direction of the corresponding side and first recess 36 and extend in a direction intersecting the corresponding side. Between the adjacent slits 38 of each slit group is adapted to be a partition wall.

Each slit 38 is opened on the upper and lower sides of the housing 26 and communicates at the lower portion on one end side (back end side) in the longitudinal direction with the lower portion on the tip end side of the corresponding first recess 36 and communicates at the upper portion on the other end side (tip end side) in the longitudinal direction with the second recess 40.

The second recess 40 has a smaller first recess area 40a around the plate-shaped portion 48 of the housing 26 and a second recess area 40b continuing into the upper portion of the first recess area 40a and larger than the first recess area 40a, as seen in a planar state.

The first and second recess areas 40a, 40b are formed in rectangular shapes analogous to the main body 14 of the device under test 12 and are formed coaxially with and analogously to it, as seen in a planar state. The slits 38 are opened at their tip end sides on one side of the rectangle of the first recess area 40a per slit group.

The area around the plate-shaped portion 48 of the housing 26 is adapted to be lower than the second recess area 40b by the first recess area 40a of the second recess 40.

The above housing 26 may be made of an electrical insulating material such as synthetic resin.

Each contact 28 has an arc-like tip end (or a probe tip) 50 to be thrust to the electrode 16 on the tip end side, a curved external surface 52, and an arc-like recess 54 opened upward on the back end side.

Each contact 28 is arranged in the housing 26 in a state of extending in an arc inside the slit 38 from within the first recess 36 under the state where its external surface 52 is on the lower side and in a state where the tip end 50 projects toward the first recess area 40a of the second recess 40.

The back end portion of each contact 28 is located within the first recess 36. The back end of each contact 28 has an inclined portion 56 at the lower portion and a projection 58 projecting backward at the upper portion. The corner portion on the lower side of the back end of each contact 28 is adapted to be an arc surface.

The inclined portion 56 of the contact 28 includes an inclined surface that is further to the front side towards the upper side so as to be able to abut on the inclined portion 42 on the backside inward surface of the first recess 36. The projection 58 projects backward from the upper end of the inclined portion 56 so as to be locked by the drop preventing portion 44 of the first recess 36 and forms an inclined surface such that the upper side is the backside.

The area on the front side of the back end portion (back end front-side area) and the area toward the tip end side from the back end front-side area (tip end area) out of each contact 28 act as an arm portion that elastically deforms when the electrode 16 of the device under test 12 is thrust by the tip end 50.

The aforementioned arm portion extends in an arc inside the slit 38 from within the first recess 36 obliquely upward and further projects upward from the slit 38 to locate the tip end 50 within the first recess area 40a of the second recess 40 in the example shown in the figures.

The back end of each contact 28 contacts the inclined portion 42 of the first recess 36 except the projection 58 and the corner portion on the lower side of the back end. The projection 58 abuts on the drop preventing portion 44 of the first recess 36.

The probe holder 30 is formed in a bar shape having a circular cross-section made of an elastic member that can be elastically deformed such as silicon rubber and corresponds to each pair consisting of a side of the rectangle and the first recess 36. Each probe holder 36 extends inside the corresponding first recess 36 in the longitudinal direction of the corresponding first recess 36.

Both the end portions of each probe holder 30 are fit in both the end portions 36a of the corresponding first recess 36 in a state of interference fit as shown in FIG. 4. This prevents each probe holder 30 from dropping from the housing 26.

The intermediate area between both the end portions of each probe holder 30 has approximately the same radius as the curvature radius of the arc surface 46 at the upper corner portion on the tip end side of the first recess 36, contacts the arc surface 46 at the upper corner portion on the tip end side of the first recess 36, and abuts on the recesses 54 of the contacts 28 of the corresponding contact group.

The guide plate 34 is formed in a rectangular shape analogous to the second recess 40 and is arranged in the second recess 40. The guide plate 34 has a rectangular recess 60 receiving the device under test 12 so that the electrodes 16 of the device under test abut on the tip ends 50 of the contacts 28.

The recess 60 is formed in a rectangular planar shape slightly larger than the device under test 12 and analogous to the main body 14 of the device under test 12. Each inward surface of the recess 60 is adapted to an inclined surface directing from the outside to the center side of the guide plate 34, and these inward surfaces define a rectangular planar shape that is smaller towards the lower side so as to guide the device under test 12.

The connecting apparatus 10 can be assembled in the following manner.

First, after each probe holder 30 is arranged in the first recess 36, the contacts 28 of each contact group are arranged in the housing 26.

As for each contact 28, the arm portion is made to go through the corresponding slit 38 from the corresponding first recess 36, and the tip end 50 is arranged in a state of projecting toward the second recess 40. Accordingly, the contact 28 is held by the housing 26 and the probe holder 30 at its back end portion and is prevented from dropping from the housing 26 by the drop preventing portion 44 and the projection 58.

Next, the guide plate 34 is arranged in the second recess area 40b of the second recess 40. The guide plate 34 is removably fixed to the housing 26 by a plurality of screw members 62 penetrating this in the thickness direction and screwed in the housing 26.

As a result of the above, the connecting apparatus 10 is assembled to enable disassembly. When the assembled connecting apparatus 10 is to be disassembled, a reverse operation of the above is done.

Under the state where the connecting apparatus 10 is assembled, the arm portion of each contact 28 extends in an arc inside the slit 38 from within the first recess 36 obliquely upward, the tip end 50 projects toward the second recess 40, and part of the tip end 50 is located within the recess 60 of the guide plate 34, as shown in FIG. 5 (A).

However, since the device under test 12 is received in the recess 60 of the guide plate 34, each contact 28 may be shaped so that the tip end 50 is not located within the recess 60.

The assembled connecting apparatus 10 is detachably attached to the board 20 by a plurality of screw members 64 penetrating the housing 26 and screwed in the board 20.

Under the state where the connecting apparatus 10 is attached to the board 20 as above, the contacts 28 contact at parts of the external surfaces 52 the conductive portions 24 of the board 20 by the probe holders 30 and are kept in such a state. Thus, the contacts 28 are surely prevented from dropping from the housing 26, and the contacts 28 and the conductive portions 24 are surely electrically connected.

When both the end portions of each probe holder 30 are fit in both the end portions of each first recess 36 in a state of interference fit, and the center area of each probe holder 30 abuts on the recesses 54 of the contacts 28 as above, the positions and postures of the contacts 28 relative to the housing 26 are stabled, and the contacts 28 are more surely prevented from dropping from the housing 26.

At the time of the test, the device under test 12 is inserted in the recess 60 of the guide plate 34 from the upper side. At this time, when the device under test 12 is displaced relative to the connecting apparatus 10, the device under test 12 abuts on the inclined surfaces of the recess 60 and is guided to the center of the recess 60 by the inclined surfaces. Accordingly, the device under test 12 is housed in the connecting apparatus 10 in a state where the electrodes 16 abut on the tip ends of the contacts 28.

When the device under test 12 arranged in the connecting apparatus 10 is pressed down by a not shown pressure body, each contact 28 compressively deforms the probe holder 30 so as to press against the probe holder 30 from the backside to the front side and angularly rolls around the probe holder 30 from the posture shown with a dashed line to the posture shown with a solid line in FIG. 5(B) (that is, a state where the back end of the contact 28 is displaced upward) in a state where part of the external surface 52 is thrust to the conductive portion 24 by an overdrive force OD.

Consequently, the contact position between the contact 28 and the conductive portion 24 is displaced forward by a distance L1 as shown in FIG. 5(B). At this time, due to a repulsive force of the probe holder 30, a force that moves backward the contact 28 along its external surface 52 acts on the contact 28.

However, since the inclined portion 42 on the backside inward surface is inclined to both the horizontal plane and the vertical plane such that the upper side is the front side, the contact 28 is prevented from moving backward as part of the back end abuts on the inclined portion 42.

Thus, slip of the contact 28 relative to the conductive portion 24 is reduced, and abrasion of the conductive portion 24 and the contact 28 is drastically reduced.

When the overdrive force acts, the contact 28 is displaced as a result of the slip of the contact part of the contact 28 relative to the inclined portion 42 on the backside inward surface, but since the lower corner portion at the back end of each contact 28 is curved in an arc, the contact part of the contact 28 with the inclined portion 42 slips smoothly relative to the inclined portion 42 on the backside inward surface, and thus the contact 28 rolls surely.

However, since the back end of each contact 28 directly contacts the inclined portion 42 on the backside inward surface of the first recess 36, each contact 28 is displaced to bring a state shown with a solid line in FIG. 5(B) with the back end lower portion as a supporting point to elastically deform the probe holder 30.

Accordingly, since the tip end 50 is displaced relative to the electrode 16 in the longitudinal direction of the contact 28, and the contact part of the contact 28 with the conductive portion 24 shifts to one on the tip end 50 side, the tip end 50 of each contact 28 causes a friction effect (or a scratch effect) that scrapes away part of the oxide film existing on the surface of the electrode 16.

Since the device under test 12 being pressed down by the pressure body causes each contact 28 to be thrust to the conductive portion 24 as above, a space may exist between the contact 28 and the conductive portion 24 so that each contact 28 is not thrust to the conductive portion 24 by the probe holder 30 in a state where the electrical connecting apparatus 10 is assembled or in a state where the device under test 12 is not pressed down by the pressure body.

Figure 6:
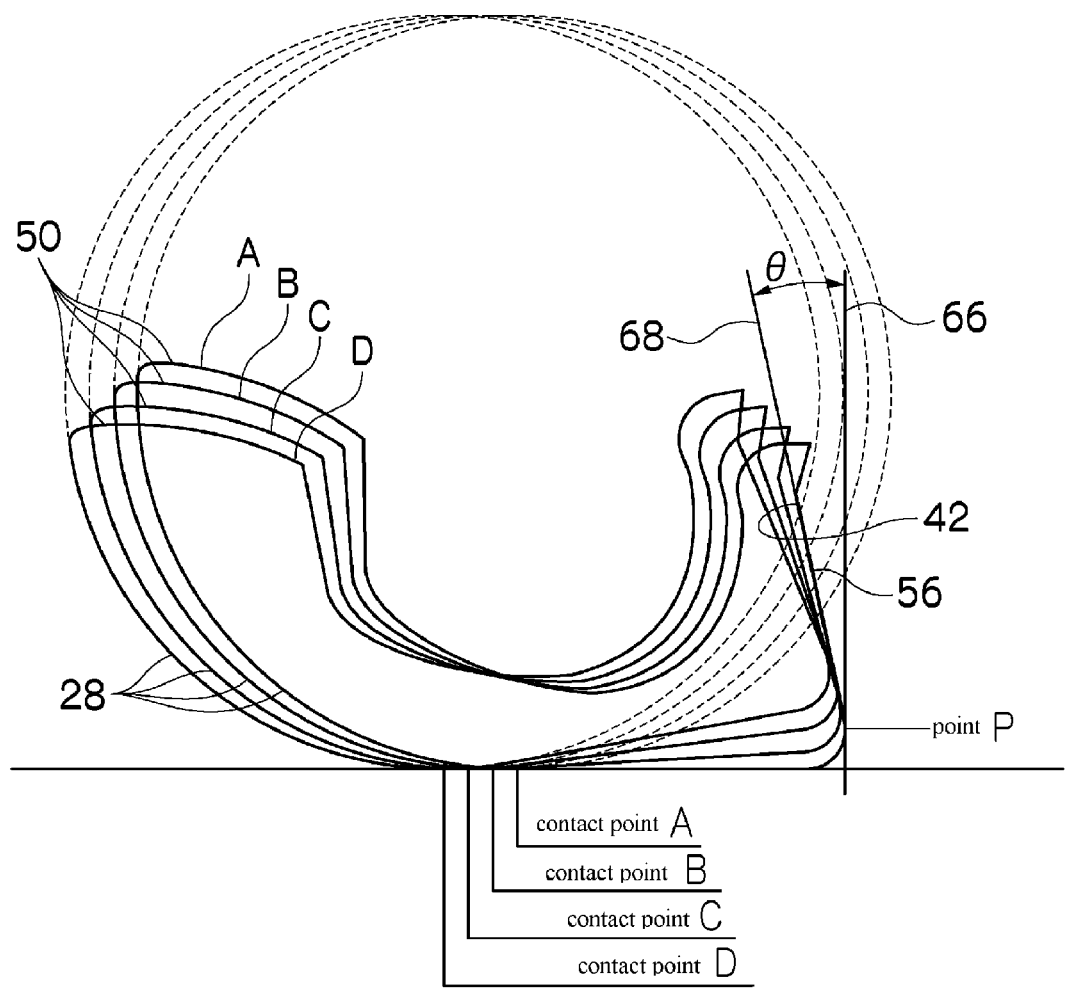
FIG. 6 shows a state where the contact rolls in the electrical connecting apparatus shown in FIG. 1.
Figure 7:
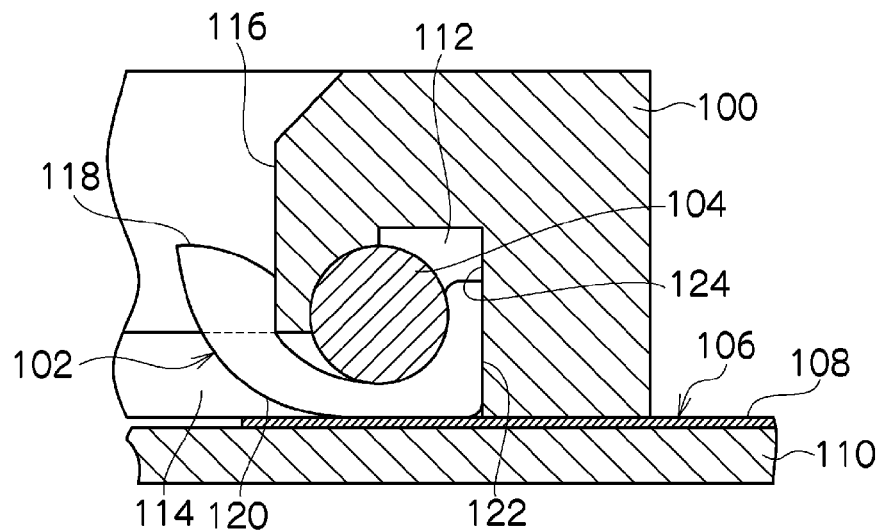
FIG. 7 shows one example of a conventional electrical connecting apparatus.
Figure 7:
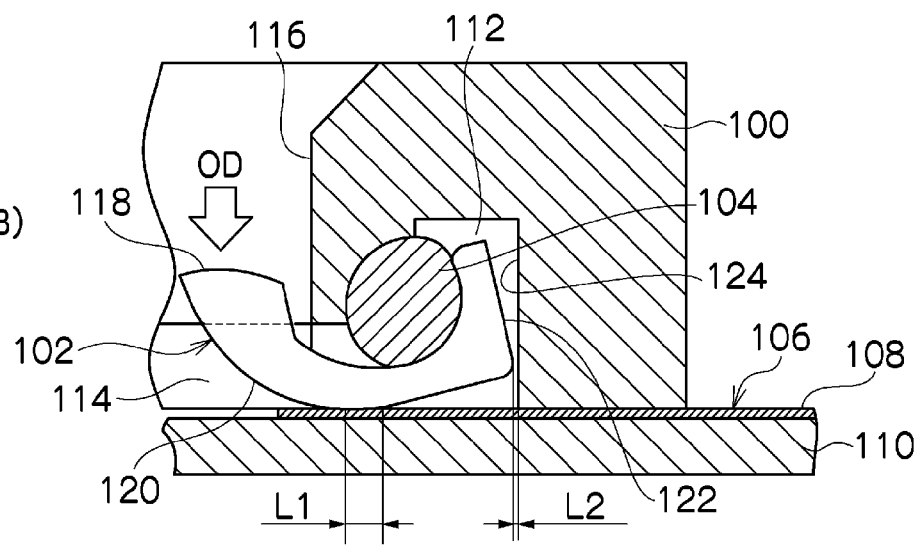
Figure 7:
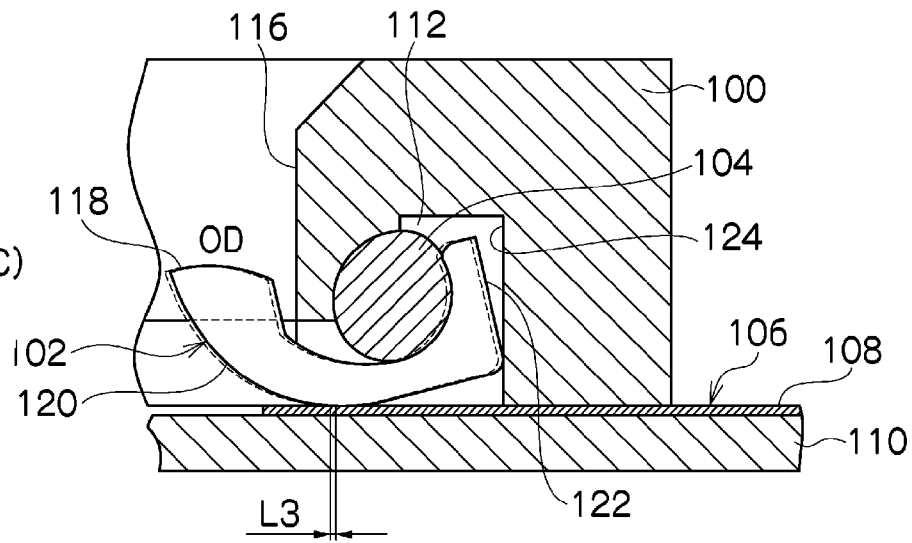

As shown in FIG. 6, an angle η of the inclined portion 42 to a vertical plane 66 can be a value at which part of the back end of the contact 28, especially the lower corner portion, always contacts the inclined surface 42 even when the tip end 50 is displaced to A, B, C, D and at which slip of the contact 28 relative to the conductive portion 24 does not occur even when the contact point between the conductive portion 24 and the contact 28 is changed to A, B, C, D.

In other words, it can be an angle, relative to the vertical line 66, of an imaginary line 68 joining the positions of P points on a cycloid curve drawn by the P points of the back end of the contact 28 when the contact 28 rolls.

An angle of the inclined portion 56 of the contact 28 to the vertical line 66 may be the same as the angle η or larger. That is, the angle of the inclined portion 56 to the vertical line 66 has only to be the angle η or larger. Also, instead of formation of the inclined portion 56 at the back end of the contact 28, the part corresponding to the inclined portion 42 may be a recessed surface.

With the connecting apparatus 10, the following effects are achieved.

Since the contacts 28 are maintained in a stable manner, electrical short among the contacts 28 is surely prevented although the structure of the probe holder 30 is simple, and the connecting apparatus 10 is manufactured easily.

The device under test 12 is arranged in the connecting apparatus 10 by itself correctly, and the electrodes 16 of the device under test 12 surely contact the tip ends 50 of the contacts 28.

As the contact 28 elastically deforms the probe holder 30, a predetermined probe pressure can be applied between the conductive portion 24 and the contact 28, and a friction effect can act on the electrode 16 effectively.

INDUSTRIAL APPLICABILITY

The present invention is not limited to the above embodiments, but can be altered without departing from the spirit of the present invention. For example, the present invention can be applied to an electrical connecting apparatus for a test of another flat-plate-shaped device under test such as a liquid crystal display panel.

The invention claimed is:

1. An electrical connecting apparatus attached to a board and electrically connecting a conductive portion formed on said board to an electrode of a device under test, comprising:

a housing having a first recess extending in a first direction in a horizontal plane, opened downward, and having at least a backside inward surface and a plurality of slits spaced in said first direction and extending in a second direction intersecting said first direction in said horizontal plane, wherein each slit communicates at one end portion in its longitudinal direction with said first recess and is opened at least upward and downward;

a plurality of contacts each arranged in said housing in a state of extending inside said slit from within said first recess, electrically connecting said conductive portion to said electrode, and each having a tip end projecting upward from said slit so as to be thrust to said electrode relatively, a back end directing to said backside inward surface, and an external surface curved and directing to said conductive portion; and a probe holder arranged in said first recess and abutting on a part opposite said external surface of said contact so as to bring said external surface of said contact into contact with said conductive portion, wherein said backside inward surface of said first recess includes a forward-inclined portion inclined to both said horizontal plane and a vertical plane, and a rearward-inclined portion inclined to both said horizontal plane and said vertical plane, the forward-inclined portion and the rearward-inclined portion meeting at a forward-protruding feature of said backside inward surface, and wherein the back end of each of said plurality of contacts includes a forward-inclined surface that abuts and opposes said forward-inclined portion of said backside inward surface when the tip end of the respective contact is not thrust to said electrode, and includes a rearward-inclined surface that abuts and opposes said rearward-inclined portion of said backside inward surface when the tip end of said respective contact is not thrust to said electrode, the forward-inclined surface and the rearward-inclined surface forming a concave feature that abuts and opposes said forward-protruding feature of said backside inward surface when the tip end of said respective contact is not thrust to said electrode.

2. The electrical connecting apparatus according to claim 1, wherein a corner portion on the lower side of said back end of each contact is curved in an arc.

3. The electrical connecting apparatus according to claim 1, wherein said housing further has a second recess opened upward and communicating at its lower end portion with the upper portion of said slit, and each contact lets said tip end project toward said second recess.

4. The electrical connecting apparatus according to claim 3, further comprising a guide plate arranged in said second recess and having an opening that guides said device under test so that said electrodes of said device under test abut on said tip ends of said contacts.

5. The electrical connecting apparatus according to claim 3, wherein each contact extends in an arc inside said slit from within said first recess.

6. An electrical connecting apparatus attached to a board and electrically connecting a conductive portion formed on said board to an electrode of a device under test, comprising:
- a housing having a first recess extending in a first direction in a horizontal plane, opened downward, and having at least a backside inward surface and a plurality of slits spaced in said first direction and extending in a second direction intersecting said first direction in said horizontal plane, wherein each slit communicates at one end portion in its longitudinal direction with said first recess and is opened at least upward and downward;
- a plurality of contacts each arranged in said housing in a state of extending inside said slit from within said first recess, electrically connecting said conductive portion to said electrode, and each having a tip end projecting upward from said slit so as to be thrust to said electrode relatively, a back end directing to said backside inward surface, and an external surface curved and directing to said conductive portion; and
- a probe holder arranged in said first recess and abutting on a part opposite said external surface of said contact so as to bring said external surface of said contact into contact with said conductive portion,
- wherein said backside inward surface of said first recess includes an inclined portion inclined to both said horizontal plane and a vertical plane vertical thereto such that the front side becomes higher, and each contact abuts on said inclined portion at least at part of said back end, and
- wherein said first recess has on the upper side of said inclined portion a drop preventing portion preventing said contacts from dropping from said first recess in cooperation with said back ends of said contacts.

7. The electrical connecting apparatus according to claim 6, wherein said drop preventing portion includes an engaging surface set back from the upper end of said inclined portion of said drop preventing portion such that the backside becomes higher, and each contact has at the upper portion of said inclined portion of said contact a projection projecting backward so as to be able to engage with said engaging surface.

* * * * *